United States Patent
Lee

(10) Patent No.: US 6,977,226 B2
(45) Date of Patent: Dec. 20, 2005

(54) SEMICONDUCTOR MEMORY DEVICE AND METHOD FOR FABRICATING THE SAME

(75) Inventor: Sung-Kwon Lee, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 102 days.

(21) Appl. No.: 10/612,922

(22) Filed: Jul. 7, 2003

(65) Prior Publication Data

US 2005/0017280 A1    Jan. 27, 2005

(30) Foreign Application Priority Data

Dec. 26, 2002 (KR) .................... 10-2002-0084154

(51) Int. Cl.$^7$ .......................................... H01L 21/302
(52) U.S. Cl. ................ 438/689; 438/184; 438/230; 438/265; 438/303; 438/595
(58) Field of Search ................ 438/184, 230, 438/265, 303, 595, 689

(56) References Cited

U.S. PATENT DOCUMENTS

| | | | |
|---|---|---|---|
| 6,060,176 A | * | 5/2000 | Semkow et al. ........... 428/620 |
| 6,166,439 A | * | 12/2000 | Cox ........................... 257/758 |
| 6,181,011 B1 | * | 1/2001 | Rostoker et al. ............ 257/758 |
| 6,277,726 B1 | | 8/2001 | Kitch et al. |
| 6,281,587 B1 | * | 8/2001 | Nogami et al. ............. 257/758 |
| 6,552,435 B2 | | 4/2003 | Noble |

FOREIGN PATENT DOCUMENTS

| | | |
|---|---|---|
| JP | 2000-156383 | 6/2000 |
| KR | 1020000048262 | 7/2000 |

* cited by examiner

*Primary Examiner*—Andy Huynh
(74) *Attorney, Agent, or Firm*—Mayer, Brown, Rowe & Maw LLP

(57) ABSTRACT

The present invention provides a semiconductor memory device capable of preventing bridge formations in a peripheral circuit region and improving a process margin and a method for fabricating the same. The semiconductor memory device includes: a cell region; a peripheral circuit region adjacent to the cell region; and a plurality of line patterns formed in the cell region and the peripheral circuit region, wherein a spacing distance between the line patterns is at least onefold greater than a width of the line pattern.

9 Claims, 6 Drawing Sheets

SEMICONDUCTOR MEMORY DEVICE AND METHOD FOR FABRICATING THE SAME

FIELD OF THE INVENTION

The present invention relates to a semiconductor device; and, more particularly, to a semiconductor memory device capable of improving a process margin in a peripheral circuit region and a method for fabricating the same.

DESCRIPTION OF RELATED ARTS

FIG. 1 is a top view schematically showing a conventional semiconductor memory device.

As shown, the semiconductor memory device 100 includes, e.g., four cell regions 101A to 101D and a peripheral circuit region 102.

A cell efficiency of the semiconductor memory device, e.g., a dynamic random access memory (DRAM), typically ranges from about 60% to about 70%. The cell efficiency is a ratio of a cell region with respect to the total region (that is, the sum of the cell regions 101A to 101D and the peripheral circuit region 102). Generally, a design rule, i.e., a pattern density, of the peripheral circuit region 102 is decreased by about 10% to about 30% of the pattern density of the cell regions 101A to 101D.

FIG. 2 is a cross-sectional view illustrating a semiconductor memory device wherein line patterns are formed in a cell region and a peripheral circuit region.

As shown, a plurality of line patterns 103A and 103B, e.g., bit lines, are formed on a substrate SUB divided into a cell region 101 and a peripheral circuit region 102.

Meanwhile, the peripheral circuit region 102 should be applied with the nearly identical design rule for the cell region in order to increase the cell efficiency. That is, the line pattern 103B in the peripheral circuit region 102 has a ratio of a width W to a spacing distance D in about 1:1.

However, in the above case, a bridge 104 is formed between conductive layers 10 of the line pattern 103B due to scummy remnants or a stringer caused by a loading phenomenon between the cell region 101 and the peripheral circuit region 102. The scummy remnants are produced during an etch process for forming the line pattern 103B due to an insufficient spacing distance D of the line pattern 103B in the peripheral circuit region 102.

Also, there also occurs a problem when forming a deep contact hole if the pattern density of the peripheral circuit region 102 increases.

FIG. 3 is a cross-sectional view schematically showing a conventional semiconductor memory device, wherein a deep contact hole is formed in a peripheral circuit region.

Referring to FIG. 3, a first insulation layer 13 is formed on a predetermined portion of a substrate SUB and line patterns 103A and 103B. Then, a second insulation layer 14 is formed thereon. In a cell region 101, a capacitor 15 electrically connected to a source/drain junction region (not shown) of a substrate SUB through a plug 18 is formed. In the mean time, a photoresist pattern 16 for forming a deep contact hole 19 is formed in a peripheral circuit region 102.

Next, the second insulation layer 14 is etched by using the photoresist pattern 16 as an etch mask so as to form the deep contact hole 19 exposing the conductive layer 10 of the line pattern 103B.

As micronization of a semiconductor device has been accelerated, in the cell region 101, a height of the capacitor 15 also increases in order to augment a cell capacitance within a limited narrow area. Thus, in the peripheral circuit region 102, a height of the insulation layer 14 also increases proportionally.

However, the above increases of height provoke some problems; those are, an increased thickness of an etch target during the deep contact hole 19 formation, a shortage of an overlap margin in the etch process for forming the contact hole 19 and a decreased contact area to the conductive layer 10 in case that a misalignment occurs. The decreased contact area is denoted as a reference numeral 17 in FIG. 3 and is a factor for increasing a contact resistance.

SUMMARY OF THE INVENTION

It is, therefore, an object of the present invention to provide a semiconductor memory device capable of efficiently preventing bridge formations in a peripheral circuit region and improving a process margin and a method for fabricating the same.

In accordance with an aspect of the present invention, there is provided a semiconductor memory device, including: a cell region; a peripheral circuit region adjacent to the cell region; and a plurality of line patterns formed in the cell region and the peripheral circuit region, wherein a spacing distance between the line patterns is at least onefold greater than a width of the line pattern.

In accordance with another aspect of the present invention, there is also provided a method for fabricating a semiconductor memory device including a cell region and a peripheral circuit region, including the steps of: forming a plurality of line patterns in the cell region and the peripheral circuit region, each being formed by stacking a conductive layer and an insulating hard mask; removing the insulating hard mask formed in the peripheral circuit region; forming a conductive spacer at sidewalls of each line pattern in the peripheral circuit region, wherein a spacing distance between the line patterns is at least onefold greater than a width of the line pattern; forming an insulation layer on an entire surface of the resulting structure; forming a photoresist pattern for forming a contact hole exposing the conductive layer on the insulation layer; and forming a deep contact hole exposing the conductive layer by etching the insulation layer with use of the photoresist pattern as an etch mask.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Hereinafter, with reference to FIGS. 4A to 4E, a semiconductor memory device including a deep contact hole and a method for fabricating the same will be described in detail.

Figure 1:
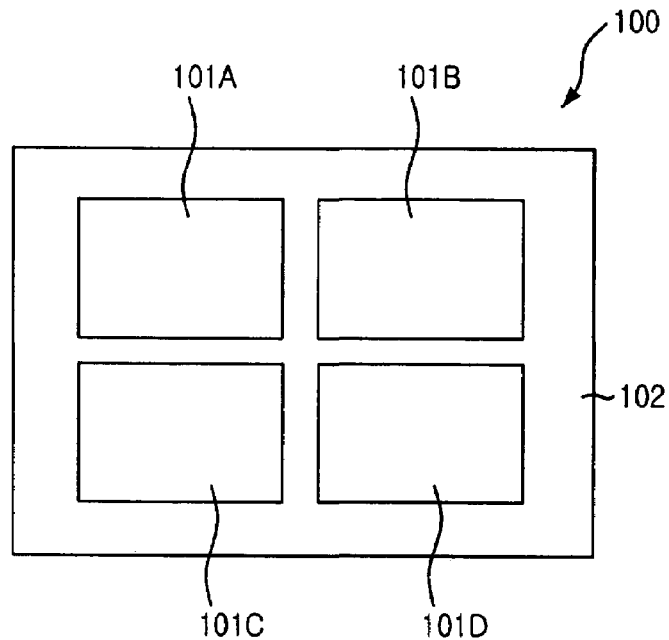
FIG. 1 is a top view schematically showing a conventional semiconductor memory device.
Figure 2:
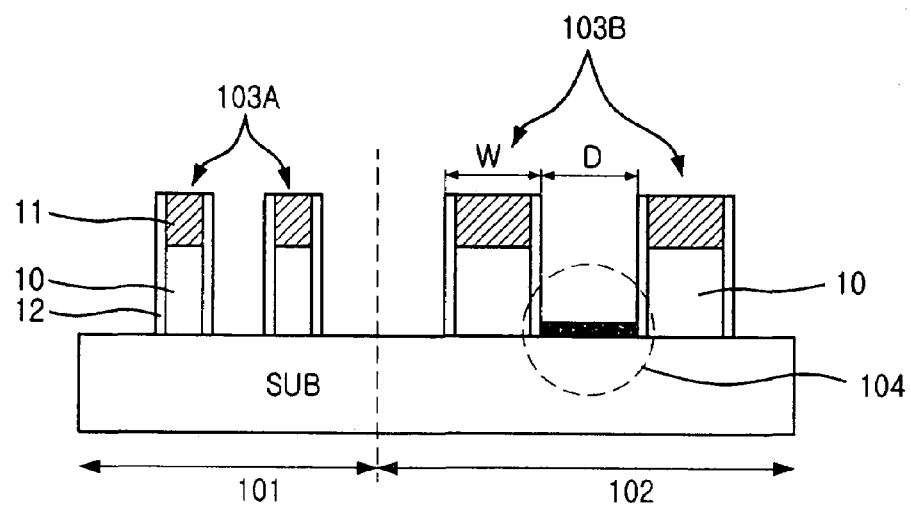
FIG. 2 is a cross-sectional view illustrating a conventional semiconductor memory device, wherein a plurality of line patterns are formed in a cell region and a peripheral circuit region.
Figure 3:
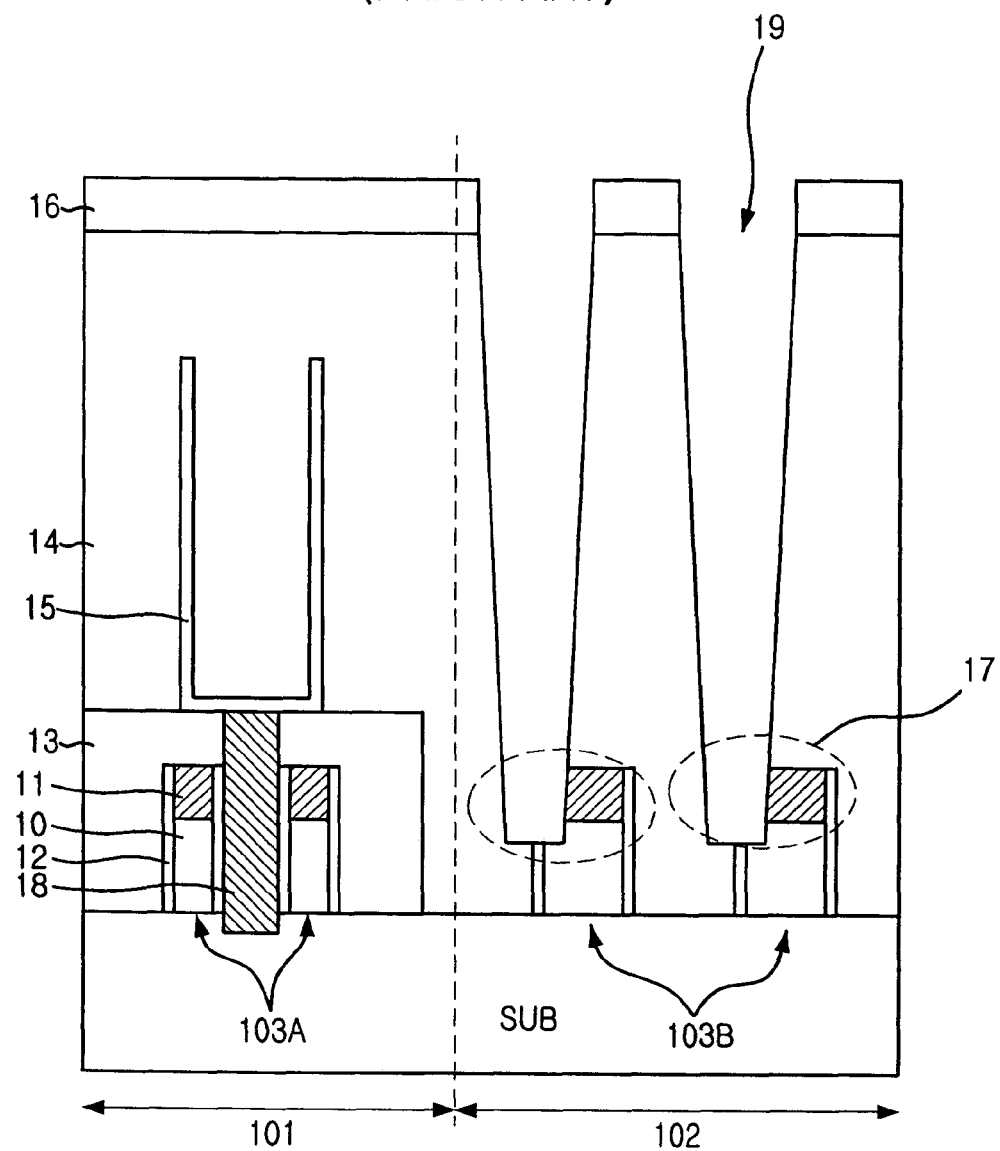
FIG. 3 is a cross-sectional view schematically showing a conventional semiconductor memory device including a deep contact hole formed in the peripheral circuit region shown in FIG. 2.
Figure 4A:
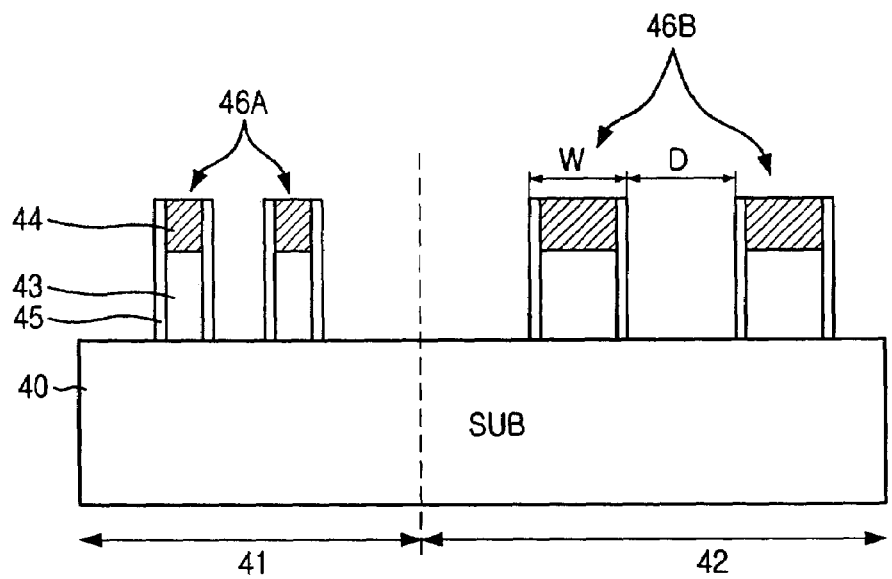
FIGS. 4A to 4E are cross-sectional views showing a process for forming a deep contact hole in accordance with a preferred embodiment of the present invention.

FIG. 4A is a cross-sectional view showing a plurality of line patterns. The line patterns in a cell region and a peripheral circuit region have a different ratio of a width W to a spacing distance D. Herein, the spacing distance D means a distance between the line patterns.

As shown, the semiconductor memory device is divided into a cell region 41 and a peripheral circuit region 42. In each of these cell and peripheral circuit regions 41 and 42, a plurality of line patterns 46A and 46B are formed in a uniformly disposed arrangement.

In the cell region 41, the line pattern 46A has a ratio of a width W to a spacing distance D in about 1:1. On the other hand, in the peripheral circuit region 42, a ratio of the width W of the line pattern 46B to the spacing distance D between the line patterns 46B is in a range of about 1:1.05 to about 1:1.30. That is, the spacing distance D between the line patterns 46B in the peripheral circuit region 42 is larger than the width of the line pattern 46B by about 5% to about 30%. Therefore, it is possible to prevent a bridge formation between the line patterns 46B caused by scummy remnants or a stringer.

Meanwhile, a ratio of the width W of the line pattern 46B in the peripheral circuit region 42 to that of the line pattern 46A in the cell region 41 is in a range of about 1:1 to about 1:1.3.

Herein, the line patterns 46A and 46B are conductive patterns such as bit lines and the like and include a conductive layer 43 contacted to a substrate 40, a hard mask 44 deposited on top of the conductive layer 43 and a spacer 45 allocated at sidewalls of the conductive layer 43 and the hard mask 44.

The conductive layer 43 is made of W or TiN. Each of the hard mask 44 and the spacer 45 is formed with a nitride-based layer such as a silicon nitride layer or a silicon oxide nitride layer.

Figure 4B:
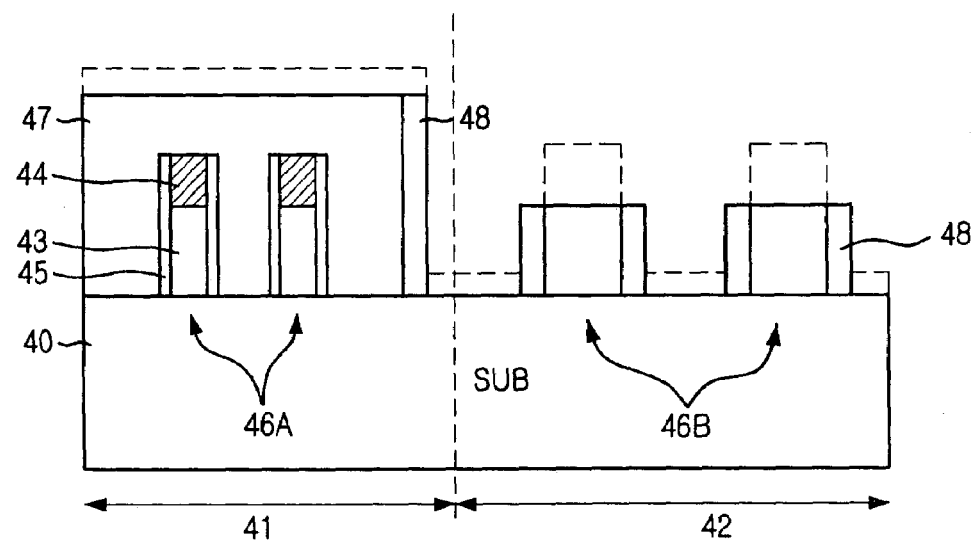

Referring to FIG. 4B, the above process for forming the line patterns 46A and 46B in the cell and peripheral circuit regions 41 and 42 will be explained in more detail.

On the substrate 40 providing several constitution elements of the semiconductor memory device, the conductive layer 43 and the nitride-based layer for the hard mask 44 are sequentially deposited. Then, a selective etch process is proceeded with use of a mask pattern for forming a line pattern so that a plurality of the line patterns 46A and 46B are formed in the cell region 41 and the peripheral circuit region 42, respectively.

At this time, as described above, the ratio of the width W of the line pattern 46A with respect to the spacing distance D between the line patterns 46A is about 1:1 in the cell region 41. This ratio is typically used in a semiconductor memory device. In the mean time, in the peripheral circuit region 42, the ratio of the width W of the line pattern 46B to the spacing distance D between the line patterns 46B is in a range of about 1:1.05 to about 1:1.30.

Next, the nitride-based layer is deposited and proceeded with a blanket-etch process to thereby form the spacer 45 at sidewalls of the line patterns 46A.

An oxide-based first insulation layer 47 is deposited on the above resulting structure. Herein, the first insulation layer 47 can be a single or stack layer of oxide-based layers. Examples of the oxide-based layer are a boron-phosphorus-silicate glass (BPSG) layer, a low pressure tetra-ethyl-ortho silicate (LPTEOS) layer, a plasma enhanced tetra-ethyl-ortho silicate (PETEOS) layer, a phosphorus-silicate glass (PSG) layer and a boron-silicate glass (BSG) layer.

After the first insulation layer 47 deposition, a peripheral circuit region 42 open mask (not shown) for masking only the cell region 41 is formed, and the first insulation layer 47 and the hard mask 44 of the peripheral circuit region 42 are removed. After the removal, a photoresist strip process is performed to remove the peripheral circuit region 42 open mask.

Next, a conductive layer is thinly deposited on the above entire structure. A blanket-etch process is then performed to form a conductive spacer 48 at sidewalls of the line patterns 46B without the hard mask 44 in the peripheral circuit region 42 and at a sidewall of the first insulation layer 47 in the cell region 41 adjacent to the peripheral circuit region 42. Herein, the conductive layer is made of such material as TiN, TaN, W or WN.

Dotted lines in FIG. 4B represent the conductive layer removed during the blanket-etch process. FIG. 4B is a cross-sectional view of the semiconductor memory device including the conductive spacer 48 formed at the sidewalls of the line patterns 46B in the peripheral circuit region 42 and the sidewall of the first insulation layer 47 in the cell region 41. Accordingly, there is provided an effect that the width W of the line patterns 46B in the peripheral circuit region 42 is increased as much as the thickness of the conductive spacer 48.

Figure 4C:
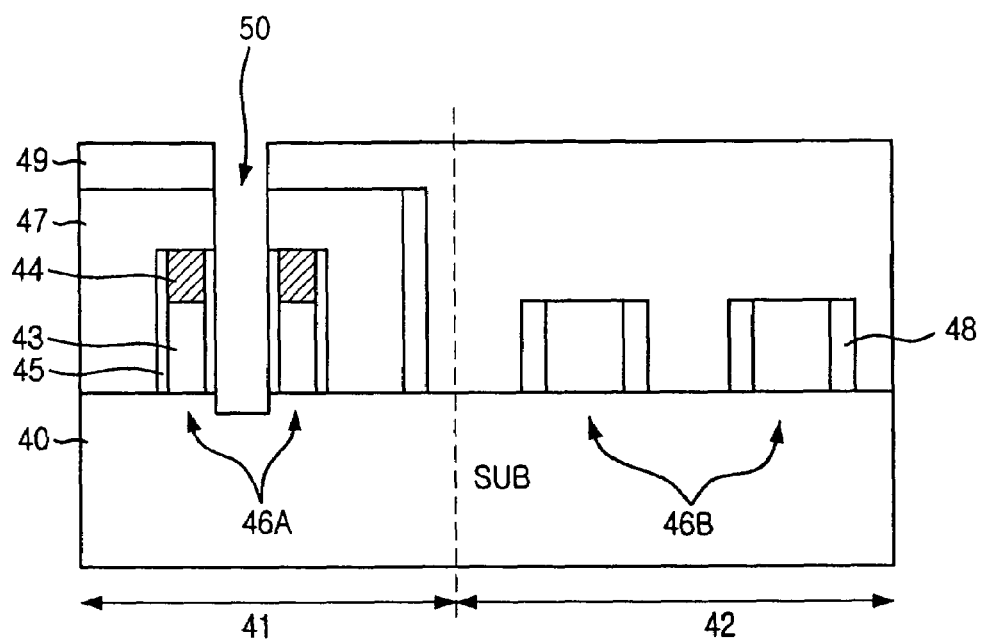

Referring to FIG. 4C, a photoresist is coated on the above entire structure and a photolithography process is applied thereto to form a photoresist pattern 49, which is a mask for a contact in the cell region 41. Afterwards, the photoresist pattern 49 is used as an etch mask to form a contact hole 50 exposing the conductive layer or impurity contact region of the substrate 40 in the cell region 41. Herein, the contact hole 50 formed in the cell region 41 is referred to as a cell contact hole.

Figure 4D:
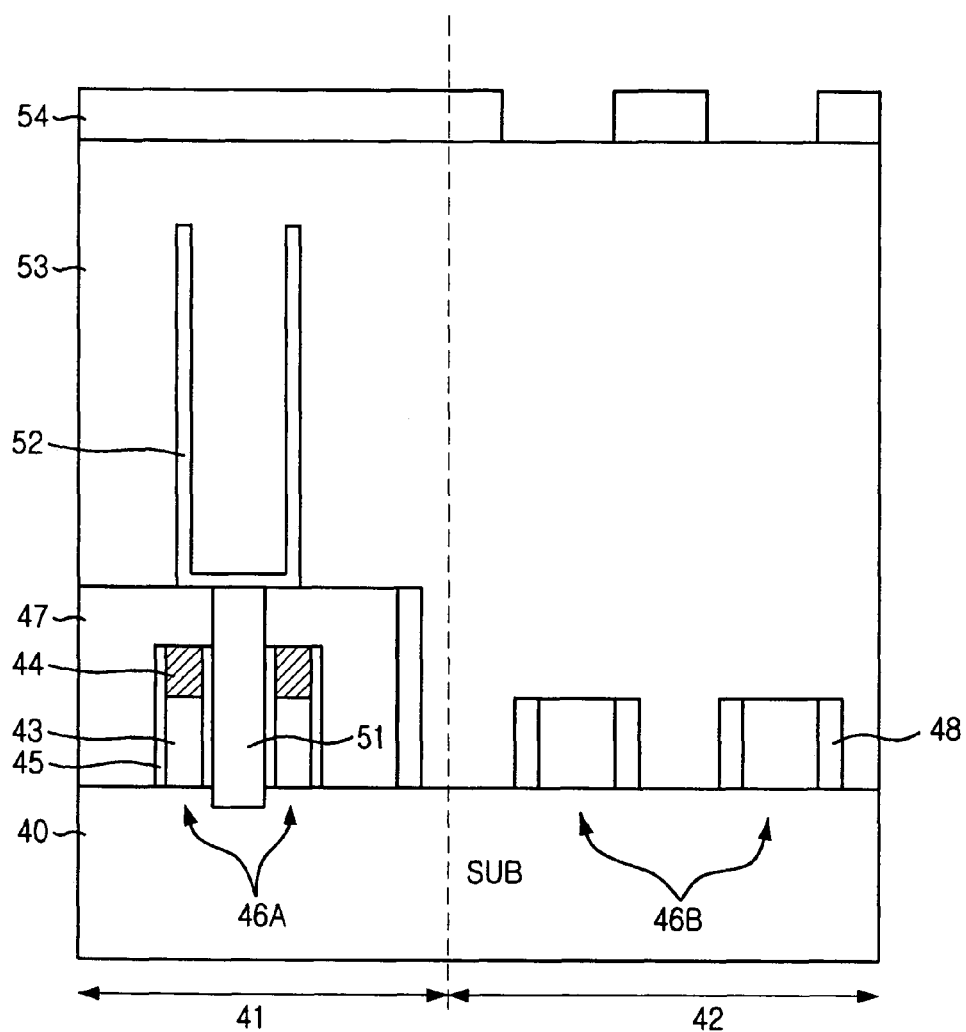
Figure 4E:
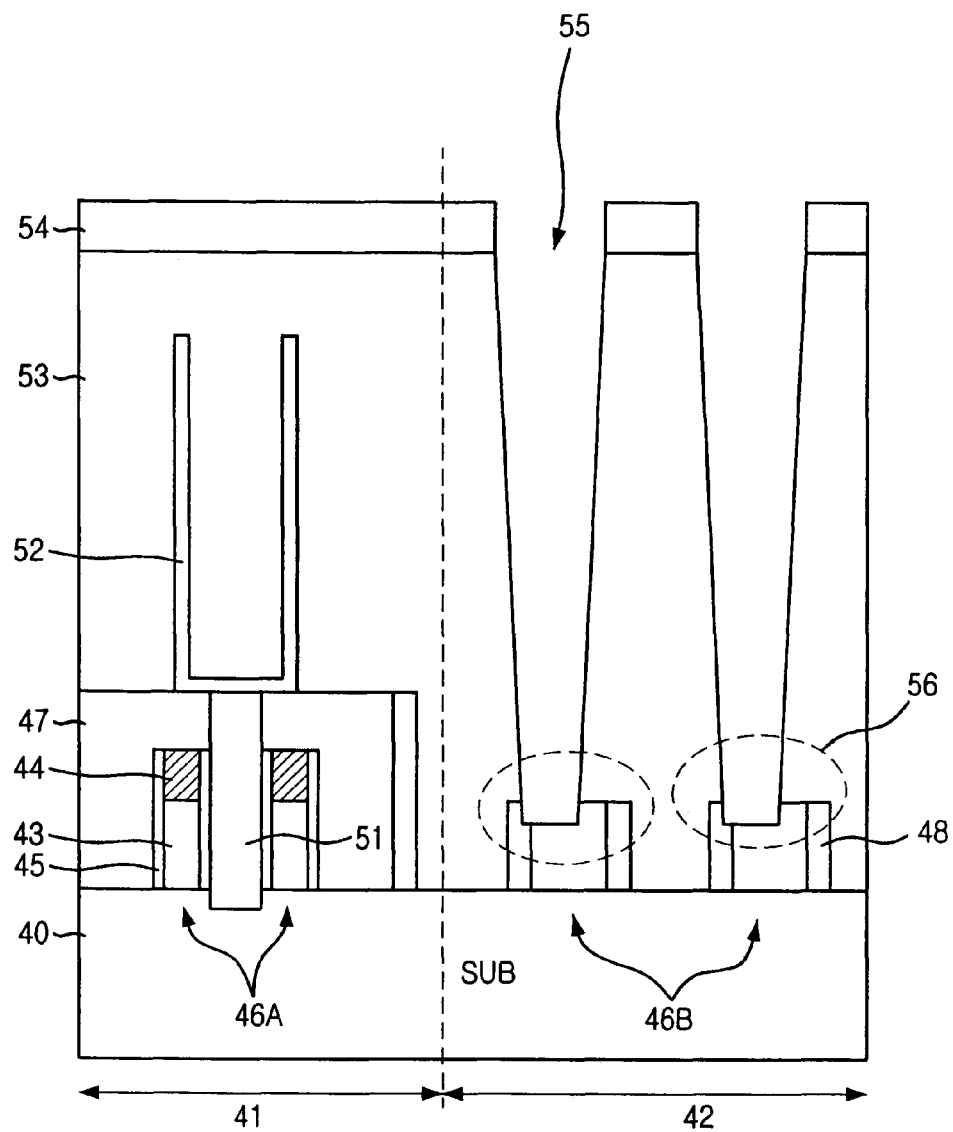

Referring to FIG. 4D, a conductive layer for forming a plug (not shown) is deposited in order to be filled into the cell contact hole 50. Hereinafter, this conductive layer is referred as to a plug conductive layer. Afterwards, a planarization process is performed to form a plug 51 buried into the first insulation layer 47 and contacted to an exposed portion of the substrate 40, and the photoresist pattern 49 is removed thereafter.

Subsequently, a capacitor 52 formation process is performed in the cell region 41. The detailed description on the capacitor 52 formation process will be omitted. In the preferred embodiment of the present invention, the capacitor 52 is a concave type.

When the capacitor 52 is formed in the cell region 41, a second insulation layer 53 having a thickness above about 10000 Å is formed in the cell region 41 and the peripheral circuit region 42. Particularly, the second insulation layer 53 has a multi-layer structure including a high density plasma (HDP) oxide layer, a BSG layer, a BPSG layer or a PSG layer.

Then, a photoresist is coated on the second insulation layer 53, and a photoresist pattern 54 for forming a contact hole is formed by performing a photolithography process using a light source of ArF or KrF in order to make a power line connection of the line patterns 46B in the peripheral circuit region 42. Herein, the above contact hole is a via hole.

The preferred embodiment of the present invention illustrates a case of using the photoresist pattern 54 having a T-shape when viewed in a plane level. However, it is still possible to use a photoresist pattern having a bar or circular shape.

After the photoresist pattern 54 is formed, the second insulation layer 53 is etched by using the photoresist pattern 54 as an etch mask to form a deep contact hole 55 exposing the conductive layer 43 of the line pattern 46B. This deep contact hole 55 is shown in the FIG. 4E.

Meanwhile, since the conductive spacer 48 is formed at the sidewalls of the line pattern 46B in the peripheral circuit region 42 according to the preferred embodiment, an actual width of the line pattern 46B is increased twice of the thickness of the conductive spacer 48. Therefore, even if there occurs a misalignment when the photolithography process for forming the photoresist pattern 54 for the deep contact hole 55 is performed, a subsequent contact area is not decreased due to the above conductive spacer 48. This effect is shown by the reference numeral 56 in FIG. 4E. Also, this unaffected contact area provides a further effect of blocking an increase of contact resistance.

The preferred embodiment of the present invention shows that the ratio of the width W to the spacing distance D in the peripheral circuit region 42 is set to be higher than that in the cell region 41, and thus, a pattern density of the peripheral circuit region 42 is lowered. This lowered pattern density prevents a bridge formation by remnants produced during the etching of the line patterns 46A and 46B.

Also, the conductive spacer 48 is formed at the sidewalls of each line pattern 46B in the peripheral circuit region 42 after the hard mask is removed. Hence, the width of the line pattern 46B in the peripheral circuit region 42 increases twice of the thickness of the conductive spacer 48. As a result of this increased width of the line pattern 46B, the contact area is not decreased even if a misalignment occurs when the deep contact hole is formed in the peripheral circuit region. Consequently, it is possible to block an increase of contact resistance. Ultimately, the above-described effects contribute to increase yields of semiconductor devices.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor memory device including a cell region and a peripheral circuit region, the method comprising:

forming a plurality of line patterns in the cell region and the peripheral circuit region, each being formed by stacking a conductive layer, an insulating hard mask, and a spacer allocated at sidewalls of each of the line patterns;

removing the entire insulating hard mask and the entire spacer formed in the peripheral circuit region;

forming a conductive spacer at sidewalls of each line pattern in the peripheral circuit region, wherein a spacing distance between the line patterns is at least onefold greater than a width of the line pattern;

forming an insulation layer on an entire surface of the resulting structure;

forming a photoresist pattern for forming a contact hole exposing the conductive layer on the insulation layer; and forming a deep contact hole exposing the conductive layer by etching the insulation layer with use of the photoresist pattern as an etch mask.

2. The method as recited in claim 1, wherein the line pattern in the peripheral circuit region has a ratio of a width to a spacing distance in a range of about 1:1.05 to about 1:1.30.

3. The method as recited in claim 1, wherein a ratio of a width of the line pattern to a spacing distance between line patterns in the cell region is about 1:1.

4. The method as recited in claim 1, wherein a ratio of the width of the line pattern in the cell region to that of the line pattern in the peripheral circuit region is in a range of about 1:1 to about 1:1.3.

5. The method as recited in claim 1, wherein the conductive spacer is made of any material selected from a group consisting of TiN, TaN, W or WN.

6. The method as recited in claim 1, wherein the spacer is formed with one of a silicon nitride layer and a silicon oxide nitride layer.

7. The method as recited in claim 1, wherein the conductive layer is made of any material selected from a group consisting of W and TiN.

8. The method as recited in claim 1, wherein the insulating hard mask is formed with one of a silicon nitride layer and a silicon oxide nitride layer.

9. The method as recited in claim 1, wherein the insulating hard mask is removed by a photoresist strip process.

* * * * *